United States Patent
Yang (10) Patent No.: US 10,957,399 B2
(45) Date of Patent: Mar. 23, 2021

(54) MEMORY AND OPERATION METHOD THEREOF

(71) Applicant: SHANGHAI HUAHONG GRACE SEMICONDUCTOR MANUFACTURING CORPORATION, Shanghai (CN)

(72) Inventor: Guangjun Yang, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 0 days.

(21) Appl. No.: 16/657,104

(22) Filed: Oct. 18, 2019

(65) Prior Publication Data

US 2020/0234769 A1 Jul. 23, 2020

(30) Foreign Application Priority Data

Jan. 22, 2019 (CN) .......................... 2019 1 0056346

(51) Int. Cl.
*G11C 16/08* (2006.01)
*G11C 16/16* (2006.01)
(Continued)

(52) U.S. Cl.
CPC .............. *G11C 16/16* (2013.01); *G11C 5/063* (2013.01); *G11C 16/08* (2013.01); *G11C 16/26* (2013.01);
(Continued)

(58) Field of Classification Search
CPC ......... G11C 16/16; G11C 5/063; G11C 16/08; G11C 16/26; G11C 16/30; H01L 27/11524
See application file for complete search history.

(56) References Cited

U.S. PATENT DOCUMENTS 6,317,349 B1 * 11/2001 Wong .................. G11C 15/046
365/185.05
6,563,736 B2 * 5/2003 Hsu .................... G11C 16/0441
257/317
(Continued)

FOREIGN PATENT DOCUMENTS

CN 102456694 A 5/2012
CN 106997881 A 8/2017
(Continued)

OTHER PUBLICATIONS

Search Report issued in First Office Action from corresponding Chinese Patent Application No. 2019100563466, dated Jun. 29, 2020, pp. 1-3.

*Primary Examiner* — Ly D Pham
(74) *Attorney, Agent, or Firm* — MKG, LLC (57) ABSTRACT

A memory is disclosed. A memory cell comprises three gate structures sequentially arrayed between a first source-drain region and a second source-drain region. A first gate structure and a third gate structure are formed by superposition of a first gate dielectric layer, a floating gate, a second gate dielectric layer and a polysilicon control gate, so that two memory bits and two control gates are formed. A second gate structure is located between the first gate structure and the third gate structure and serves as a select gate. Erasing and programming operations on the two memory bits formed by the floating gates are realized by FN tunneling. During erasing and programming, the first source-drain region and the second source-drain region are grounded, so that the memory bits can be selected and then erased or programmed only by controlling voltages of the first control gate, the select gate and the second control gate. An operation method of a memory is further disclosed. The two memory bits of the memory cell can be independently (Continued)

operated, so that operations on single memory bits are achieved, and accordingly, storage-computation integrated operations are realized.

13 Claims, 1 Drawing Sheet

(51) Int. Cl.
    *G11C 16/26*     (2006.01)
    *G11C 5/06*     (2006.01)
    *H01L 27/11524*     (2017.01)
    *G11C 16/30*     (2006.01)
    *G11C 16/10*     (2006.01)
    *H01L 27/11521*     (2017.01)
    *G11C 16/04*     (2006.01)
    *G11C 16/14*     (2006.01)
    *H01L 29/423*     (2006.01)

(52) U.S. Cl.
    CPC ........ *G11C 16/30* (2013.01); *H01L 27/11524* (2013.01); *G11C 16/0433* (2013.01); *G11C 16/10* (2013.01); *G11C 16/14* (2013.01); *H01L 27/11521* (2013.01); *H01L 29/42328* (2013.01)

(56) References Cited

U.S. PATENT DOCUMENTS

| | | | |
|---|---|---|---|
| 9,640,252 B1* | 5/2017 | Yang | G11C 11/5635 |
| 10,347,340 B2* | 7/2019 | Hu | G11C 16/0425 |
| 2002/0028541 A1* | 3/2002 | Lee | H01L 27/11556 438/149 |
| 2004/0061167 A1* | 4/2004 | Mantha | H01L 27/115 257/315 |
| 2004/0114436 A1* | 6/2004 | Hecht | H01L 27/115 365/185.28 |
| 2007/0134875 A1 | 6/2007 | Lojek | |
| 2009/0135653 A1* | 5/2009 | Kuo | G11C 16/3468 365/185.18 |
| 2011/0096610 A1* | 4/2011 | Chang | H01L 29/792 365/185.29 |
| 2015/0236033 A1 | 8/2015 | Watanabe | |
| 2016/0148942 A1* | 5/2016 | Yang | G11C 16/26 365/185.29 |
| 2016/0189780 A1* | 6/2016 | Yang | G11C 16/0433 365/185.29 |
| 2016/0284395 A1* | 9/2016 | Gu | H01L 29/42328 |
| 2016/0358665 A1* | 12/2016 | Yang | G11C 16/0458 |

FOREIGN PATENT DOCUMENTS

| | | |
|---|---|---|
| CN | 108878432 A | 11/2018 |
| CN | 108962318 A | 12/2018 |

* cited by examiner

MEMORY AND OPERATION METHOD THEREOF

CROSS REFERENCE TO RELATED APPLICATION

The present application claims priority to Chinese Patent Application No. 201910056346.6 filed on Jan. 22, 2019, the entirety of which is incorporated by reference herein.

TECHNICAL FIELD

The invention relates to the field of semiconductor integrated circuits, in particular to a memory and an operation method of a memory.

BACKGROUND OF THE INVENTION

Figure 1:
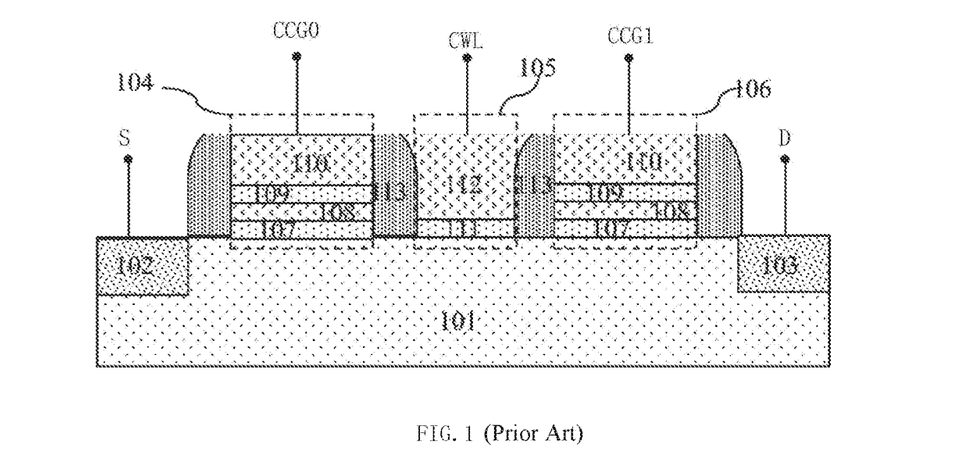
FIG. 1 is a structural view of a memory cell of an existing memory.

FIG. 1 is a structural view of a memory cell of an existing memory. As shown in FIG. 1, the memory cell 1 comprises a first gate structure 104, a second gate structure 105, a third gate structure 106, a first source-drain region 102 and a second source-drain region 103.

The first gate structure 104 is formed by superposition of a first gate dielectric layer 107, a floating gate (FG) 108, a second gate dielectric layer 109 and a polysilicon control gate 110 which are formed on a surface of a semiconductor substrate 101. The first source-drain region 102 and the second source-drain region 103 are usually N+ doped. The semiconductor substrate 101 is a P-typed doped silicon substrate.

The second gate structure 105 consists of a third gate dielectric layer 111 and a polysilicon gate 112 which are formed on the surface of the semiconductor substrate 101.

The third gate structure 106 is formed by superposition of a first gate dielectric layer 107, a floating gate 108, a second gate dielectric layer 109 and a polysilicon control gate 110 which are formed on the surface of the semiconductor substrate 101.

A channel region is formed by a part, located between the first source-drain region 102 and the second source-drain region 103, of the semiconductor substrate 101.

The first gate structure 104, the second gate structure 105 and the third gate structure 106 are arrayed on a surface of the channel region located between the first source-drain region 102 and the second source-drain region 103. Formation of a channel on the surface of the channel region is controlled by the first gate structure 104, the second gate structure 105 and the third gate structure 106.

The polysilicon control gate 110 of the first gate structure 104 serves as a first control gate CCG0 of the memory cell 1, the polysilicon gate 112 of the second gate structure 105 serves as a select gate CWL of the memory cell 1, and the polysilicon control gate 110 of the third gate structure 106 serves as a second control gate CCG1 of the memory cell 1.

The floating gate 108 of the first gate structure 104 serves as a first memory bit, and the floating gate 108 of the third gate structure 106 serves as a second memory bit.

The first source-drain region 102 is connected to a source S, and the second source-drain region 103 is connected to a drain D.

The memory bits of the existing memory are generally programmed by source-side hot electron injection (SSI). As an example, programming of the second memory bit is described as follows:

Programming Voltages:

The voltage of the select gate CWL is set as 1.4V, so that a channel is formed at the bottom of the second gate structure 105;

The voltage of the first control gate CCG0 is set as 5V, so that a channel is formed at the bottom of the first gate structure 104;

A programming current such as 2 µA is supplied to the source S;

A 5.5V voltage is applied to the drain D, and a 8V voltage is applied to the third control gate CCG1, so that a large depletion region is formed at the bottom of the third gate structure 106. Electrons from the source S flow into the depletion region at the bottom of the third gate structure 106 via the channel and are then injected into the floating gate 108 of the third gate structure 106 to fulfill programming. Such electron injection method for programming is called SSI and can fulfill programming with a small programming current. However, operations on single memory bits of the existing memory are unachievable, and thus, storage-computation integrated operations cannot be achieved.

BRIEF SUMMARY OF THE INVENTION

The technical issue to be settled by the invention is to realize independent operations on two memory bits of memory cells by providing a memory, so as to fulfill operations on single memory bits and to fulfill storage-computation integrated operations. Correspondingly, the invention further provides an operation method of a memory.

To settle the above technical issue, the invention provides a memory. The memory comprises a plurality of memory cells. Each memory cell comprises a first gate structure, a second gate structure, a third gate structure, a first source-drain region and a second source-drain region, wherein:

the first gate structure is formed by superposition of a first gate dielectric layer, a floating gate, a second gate dielectric layer and a polysilicon control gate which are formed on a surface of a semiconductor substrate;

the second gate structure consists of a third gate dielectric layer and a polysilicon gate which are formed on the surface of the semiconductor substrate;

the third gate structure is formed by superposition of a first gate dielectric layer, a floating gate, a second gate dielectric layer and a polysilicon control gate which are formed on the surface of the semiconductor substrate;

a channel region is formed by a part, located between the first source-drain region and the second source-drain region, of the semiconductor substrate;

the first gate structure, the second gate structure and the third gate structure are arrayed on a surface of the channel region located between the first source-drain region and the second source-drain region, and formation of a channel on the surface of the channel region is controlled by the first gate structure, the second gate structure and the third gate structure;

the polysilicon control gate of the first gate structure serves as a first control gate of the memory cell, the polysilicon gate of the second gate structure serves as a select gate of the memory cell, and the polysilicon control gate of the third gate structure serves as a second control gate of the memory cell;

the floating gate of the first gate structure serves as a first memory bit, the floating gate of the third gate structure serves as a second memory bit, and erasing and programming operations on the first memory bit and the second memory bit are realized by FN tunneling; during erasing or programming, the first source-drain region and the second source-drain region are grounded, so that the memory bits can be selected and then erased or programmed only by controlling voltages of the first control gate, the select gate and the second control gate.

Furthermore, all the memory cells are arrayed in rows and columns to form an array structure. As for the array structure:

in each row, the select gates of the memory cells are connected to a corresponding word line, and the first source-drain regions of the memory cells are connected to a corresponding source line;

in each column, the first control gates of the memory cells are connected to a corresponding first control line, the second control gates of the memory cells are connected to a corresponding second control line, and the second source-drain regions of the memory cells are connected to a corresponding bit line;

the memory bits of the corresponding memory cells are selected and then erased or programmed by controlling the word lines, the first control lines and the second control lines;

after being selected, the memory bits of the memory cells are read via the source lines and the bit lines.

Furthermore, the first source-drain region and the second source-drain region are N+ regions, and the semiconductor substrate is P-type doped.

Furthermore, when the first memory bit of the memory cell is erased after being selected, a first positive voltage is applied to the select gate, a first negative voltage is applied to the first control gate, and the first positive voltage is also applied to the second control gate; or when the second memory bit of the memory cell is erased after being selected, a first positive voltage is applied to the select gate, the first positive voltage is also applied to the first control gate, and a first negative voltage is applied to the second control gate;

when erased, the corresponding memory bit of the memory cell has a first threshold voltage.

Furthermore, when the first memory bit of the memory cell is programmed after being selected, a first negative voltage is applied to the select gate, a first positive voltage is applied to the first control gate, and the first negative voltage is also applied to the second control gate; or when the second memory bit of the memory cell is programmed after being selected, a first negative voltage is applied to the select gate, the first negative voltage is also applied to the first control gate, and a first positive voltage is applied to the second control gate;

when programmed, the corresponding memory bit of the memory cell has a second threshold value, wherein the second threshold voltage is greater than the first threshold voltage.

Furthermore, when the first memory bit of the memory cell is read after being selected, a second positive voltage is applied to the select gate, a third positive voltage is applied to the first control gate, a fourth positive voltage is applied to the second control gate, and a pair of reading voltages is accessed between the first source-drain region and the second source-drain region.

the second positive voltage, the third positive voltage and the fourth positive voltage are smaller than the first positive voltage;

a threshold voltage corresponding to a channel formed at a bottom of the select gate is a third threshold voltage, wherein the second positive voltage is greater than or equal to the third threshold voltage;

the third positive voltage is greater than or equal to the first threshold voltage and is smaller than the second threshold voltage, and the fourth positive voltage is greater than or equal to the second threshold voltage.

Furthermore, the memory cells in every two adjacent rows share one source line.

Furthermore, the semiconductor substrate is a silicon substrate, the floating gates are polysilicon floating gates, the first dielectric layers are oxide layers, the second dielectric layers are oxide layers, and the third gate dielectric layers are oxide layers.

To settle the above technical issue, the invention further provides an operation method of a memory. The memory comprises a plurality of memory cells. Each memory cell comprises a first gate structure, a second gate structure, a third gate structure, a first source-drain region and a second source-drain region, wherein:

the first gate structure is formed by superposition of a first gate dielectric layer, a floating gate, a second gate dielectric layer and a polysilicon control gate which are formed on a surface of a semiconductor substrate;

the second gate structure consists of a third gate dielectric layer and a polysilicon gate which are formed on the surface of the semiconductor substrate;

the third gate structure is formed by superposition of a first gate dielectric layer, a floating gate, a second gate dielectric layer and a polysilicon control gate which are formed on the surface of the semiconductor substrate;

a channel region is formed by a part, located between the first source-drain region and the second source-drain region, of the semiconductor substrate;

the first gate structure, the second gate structure and the third gate structure are arrayed on a surface of the channel region located between the first source-drain region and the second source-drain region, and formation of a channel on the surface of the channel region is controlled by the first gate structure, the second gate structure and the third gate structure;

the polysilicon control gate of the first gate structure serves as a first control gate of the memory cell, the polysilicon gate of the second gate structure serves as a select gate of the memory cell, and the polysilicon control gate of the third gate structure serves as a second control gate of the memory cell;

the floating gate of the first gate structure serves as a first memory bit, the floating gate of the third gate structure serves as a second memory bit, and erasing and programming operations on the first memory bit and the second memory bit are realized by FN tunneling; the memory cell is erased or programmed through the following method:

the first source-drain region and the second source-drain region are grounded;

the memory bits are selected and then erased or programmed by controlling voltages of the first control gate, the select gate and the second control gate.

Furthermore, all the memory cells are arrayed in rows and columns to form an array structure. As for the array structure:

in each row, the select gates of the memory cells are connected to a corresponding word line, and the first source-drain regions of the memory cells are connected to a corresponding source line;

in each column, the first control gates of the memory cells are connected to a corresponding first control line, the second control gates of the memory cells are connected to a corresponding second control line, and the second source-drain regions of the memory cells are connected to a corresponding bit line;

the memory bits of the corresponding memory cells are selected and then erased or programmed by controlling the word lines, the first control lines and the second control lines;

after being selected, the memory bits of the memory cells are read via the source lines and the bit lines.

Furthermore, the first source-drain region and the second source-drain region are N+ regions, and the semiconductor substrate is P-type doped.

Furthermore, when the first memory bit of the memory cell is erased after being selected, a first positive voltage is applied to the select gate, a first negative voltage is applied to the first control gate, and the first positive voltage is also applied to the second control gate; or when the second memory bit of the memory cell is erased after being selected, a first positive voltage is applied to the select gate, the first positive voltage is also applied to the first control gate, and a first negative voltage is applied to the second control gate;

when erased, the corresponding memory bit of the memory cell has a first threshold voltage.

Furthermore, when the first memory bit of the memory cell is programmed after being selected, a first negative voltage is applied to the select gate, a first positive voltage is applied to the first control gate, and the first negative voltage is also applied to the second control gate; or when the second memory bit of the memory cell is programmed after being selected, a first negative voltage is applied to the select gate, the first negative voltage is also applied to the first control gate, and a first positive voltage is applied to the second control gate;

when programmed, the corresponding memory bit of the memory cell has a second threshold value, wherein the second threshold voltage is greater than the first threshold voltage.

Furthermore, when the first memory bit of the memory cell is read after being selected, a second positive voltage is applied to the select gate, a third positive voltage is applied to the first control gate, a fourth positive voltage is applied to the second control gate, and a pair of reading voltages is accessed between the first source-drain region and the second source-drain region;

the second positive voltage, the third positive voltage and the fourth positive voltage are smaller than the first positive voltage;

a threshold voltage corresponding to a channel formed at a bottom of the select gate is a third threshold voltage, wherein the second positive voltage is greater than or equal to the third threshold voltage;

the third positive voltage is greater than or equal to the first threshold voltage and is smaller than the second threshold voltage, and the fourth positive voltage is greater than or equal to the second threshold voltage.

Furthermore, the memory cells in every two adjacent rows share one source line.

Each memory cell of the memory comprises two symmetrical memory bits which can be programmed and erased only by controlling voltages of the first control gate, the select gate and the second control gate, the two source-drain regions (the first source-drain region and the second source-drain region) are grounded, so that the two memory bits of the memory cell can be independently operated, operations on single memory bits are achieved, and accordingly, storage-computation integrated operations are achieved.

BRIEF DESCRIPTION OF THE DRAWINGS

The invention is further expounded below with reference to accompanying drawings and specific embodiments.

DETAILED DESCRIPTION OF PREFERRED EMBODIMENTS OF THE INVENTION

Figure 2:
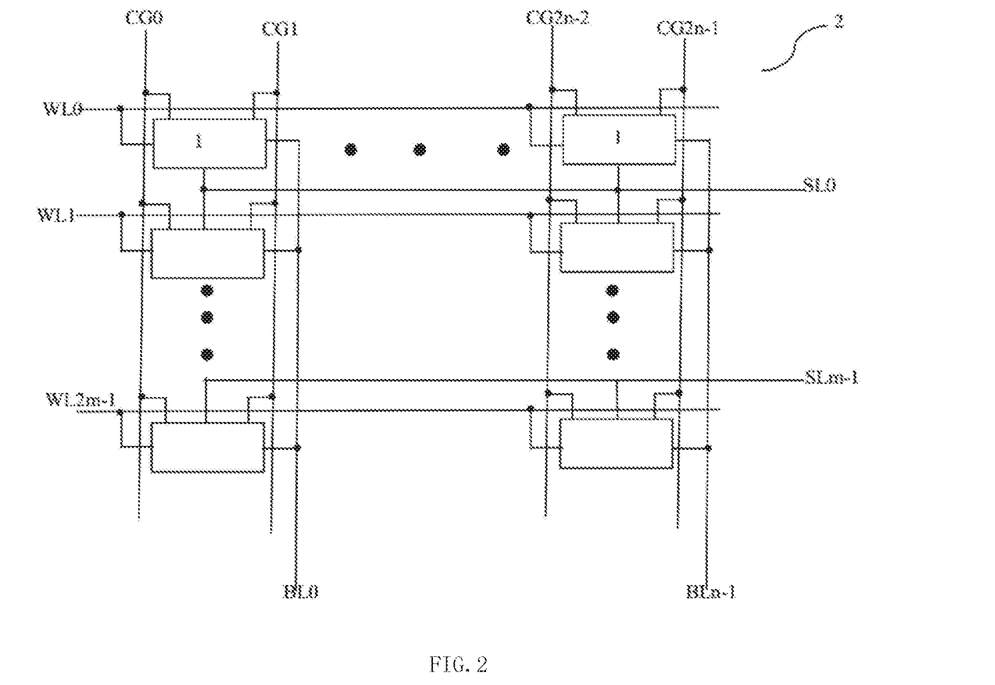
FIG. 2 is a view of an array structure of a memory in one embodiment of the invention.

Memory in One Embodiment of the Invention:

FIG. 2 is a view of an array structure 2 of a memory in one embodiment of the invention. Please refer to FIG. 1 for the structure of memory cells 1 of the memory in this embodiment. In this embodiment, the memory comprises a plurality of memory cells 1. Each memory cell 1 comprises a first gate structure 104, a second gate structure 105, a third gate structure 106, a first source-drain region 102 and a second source-drain region 103.

The first gate structure 104 is formed by superposition of a first gate dielectric layer 107, a floating gate 108, a second gate dielectric layer 109 and a polysilicon control gate 110 which are formed on a surface of a semiconductor substrate 101.

The second gate structure 105 consists of a third gate dielectric layer 111 and a polysilicon gate 112 which are formed on the surface of the semiconductor substrate 101.

The third gate structure 106 is formed by superposition of a first gate dielectric layer 107, a floating gate 108, a second gate dielectric layer 109 and a polysilicon control gate 110 which are formed on the surface of the semiconductor substrate 101.

A channel region is formed by a part, located between the first source-drain region 102 and the second source-drain region 103, of the semiconductor substrate 101.

The first gate structure 104, the second gate structure 105 and the third gate structure 106 are arrayed on a surface of the channel region located between the first source-drain region 102 and the second source-drain region 103, and formation of a channel on the surface of the channel region is controlled by the first gate structure 104, the second gate structure 105 and the third gate structure 106.

The polysilicon control gate 110 of the first gate structure 104 serves as a first control gate CCG0 of the memory cell 1, the polysilicon gate 112 of the second gate structure 105 serves as a select gate CWL of the memory cell 1, and the polysilicon control gate 110 of the third gate structure 106 serves as a second control gate CCG1 of the memory cell 1. In FIG. 1, the first source-drain region 102 is connected to a source S, and the second source-drain region 103 is connected to a drain D.

The floating gate 108 of the first gate structure 104 serves as a first memory bit, and the floating gate 108 of the third gate structure 106 serves as a second memory bit. Erasing and programming operations on the first memory bit and the second memory bit are realized by FN tunneling. During erasing or programming, the first source-drain region 102 and the second source-drain region 103 are grounded, so that the memory bits can be selected and then erased or programmed only by controlling voltages of the first control gate CCG0, the select gate CWL and the second control gate CCG1. The voltage of the source S and the voltage of the drain D are set as 0V.

All the memory cells 1 are arrayed in rows and columns to form an array structure 2. As for the array structure 2:

In each row, the select gates CWL of the memory cells 1 are connected to a corresponding word line (WL). In FIG. 2, the array structure includes 2m rows and n columns, wherein the memory cells 1 in the n columns include 2n columns of memory bits. The word line in each row is represented by WL and the corresponding row number, for instance, WL0 to WL2m−1.

The first source-drain regions 102 of the memory cells 1 are connected to corresponding source lines (SL) via the sources S in FIG. 1. In FIG. 2, the memory cells 1 in every two adjacent rows share one source line, so that there are totally m source lines. The source line in each row is represented by SL and the corresponding row number, for instance, SL0 to SLm−1.

In each column, the first control gates CCG0 of the memory cells 1 are connected to a corresponding first control line (CG), and the second control gates CCG1 of the memory cells 1 in each column are connected to a corresponding second control line. Due to the fact that there are totally 2n columns of memory bits, the first control line and the second control line of the memory cells 1 are presented by CG and the column numbers of the memory bits, for instance, CG0, CG1 to CG2n−2 and CG2n−1, wherein as for the memory cells 1 in each column, the column number corresponding to the first control line is one smaller than the column number corresponding to the second control line. The second source-drain regions 103 of the memory cells 1 are connected to corresponding bit lines (BL) via the drains D in FIG. 1. The bit line in each column is represented by BL and the corresponding column number, for instance, BL0 to BLn−1.

The memory bits of the memory cells 1 can be correspondingly selected and then erased or programmed by controlling the word lines, the first control lines and the second control lines, and corresponding voltages can be applied to the select gates CWL, the first control gates CCG0 and the second control gates CCG1 of the corresponding memory cells 1 via the word lines, the first control lines and the second control lines.

After being selected, the memory bits of the memory cells 1 can be read via the source lines and the bit lines, and corresponding voltages can be applied to the sources S and the drains D of the corresponding memory cells 1 via the source lines and the bit lines.

In this embodiment, the first source-drain region 102 and the second source-drain region 103 are N+ regions, and the semiconductor substrate 101 is P-type doped.

When the first memory bit of the memory cell 1 is erased after being selected, a first positive voltage is applied to the select gate CWL, a first negative voltage is applied to the first control gate CCG0, and the first positive voltage is also applied to the second control gate CCG1.

When the second memory bit of the memory cell 1 is erased after being selected, a first positive voltage is applied to the select gate CWL, the first positive voltage is also applied to the first control gate CCG0, and a first negative voltage is applied to the second control gate CCG1.

When erased, the corresponding memory bit of the memory cell 1 has a first threshold voltage.

When the first memory bit of the memory cell 1 is programmed after being selected, a first negative voltage is applied to the select gate CWL, a first positive voltage is applied to the first control gate CCG0, and the first negative voltage is also applied to the second control gate CCG1.

When the second memory bit of the memory cell 1 is programmed after being selected, a first negative voltage is applied to the select gate CWL, the first negative voltage is also applied to the first control gate CCG0, and a first positive voltage is applied to the second control gate CCG1.

When programmed, the corresponding memory bit of the memory cell 1 has a second threshold value, wherein the second threshold voltage is greater than the first threshold voltage.

When the first memory bit of the memory cell 1 is read after being selected, a second positive voltage is applied to the select gate CWL, a third positive voltage is applied to the first control gate CCG0, a fourth positive voltage is applied to the second control gate CCG1, and a pair of reading voltages is accessed between the first source-drain region 102 and the second source-drain region 103.

The second positive voltage, the third positive voltage and the fourth positive voltage are smaller than the first positive voltage.

A threshold voltage corresponding to the channel formed at the bottom of the select gate CWL is a third threshold voltage, wherein the second positive voltage is greater than or equal to the third threshold voltage.

The third positive voltage is greater than or equal to the first threshold voltage and is smaller than the second threshold voltage, and the fourth positive voltage is greater than or equal to the second threshold voltage.

In this embodiment, the semiconductor substrate 101 is a silicon substrate, the floating gates 108 are polysilicon floating gates, the first dielectric layers 107 are oxide layers, the second dielectric layers 109 are oxide layers, and the third gate dielectric layers 111 are oxide layers.

In this embodiment, each memory cell 1 of the memory comprises two symmetrical memory bits which can be programmed or erased only by controlling voltages of the first control gate CCG0, the select gate CWL and the second control gate CCG1, and the two source-drain regions (the first source-drain region 102 and the second source-drain region 103) are grounded, so that the two memory bits of each the memory cell 1 can be independently operated, operations on single memory bits are achieved, and accordingly, storage-computation integrated operations are achieved.

A more detailed description of the working principle for conducting corresponding operations, including erasing, programming and reading, on the memory cell 1 of the memory in this embodiment is given below in combination with corresponding electric values, with the first memory bit corresponding to the first gate structure 104 in FIG. 1 as an example:

Erasing operation: a +6V voltage is applied to the select gate CWL, a −6V voltage is applied to the first control gate CCG0, a +6V voltage is applied to the second control gate CCG1, and the voltage of the source S and the voltage of the drain D are set as 0V. As can be seen from here, the first positive voltage is +6V, and the first negative voltage is −6V.

Programming operation: a −6V voltage is applied to the select gate CWL, a +6V voltage is applied to the first control gate CCG0, a −6V voltage is applied to the second control gate CCG1, and the voltage of the source S and the voltage of the drain D are set as 0V.

Reading operation: a 2V voltage is applied to the select gate CWL, a 1V voltage is applied to the first control gate CCG0, a 5V voltage is applied to the second control gate CCG1, Vio0 is applied to the source S, and Vio1 is applied to the source S. Correspondingly, the second positive voltage is 2V, the third positive voltage is 1V, the fourth positive voltage is 5V, and Vio0 and Vio1 correspond to the reading voltages accessed between the first source-drain region 102 and the second source-drain region 103. Apparently, the third threshold voltage is smaller than 2V, so that a channel is formed at the bottom of the select gate CWL; the first threshold voltage is smaller than or equal to 1V and the second threshold voltage is greater than 1V, so that information stored in the first control gate CGG0 can be accurately read; and the second threshold voltage is smaller than or equal to 5V, so that a channel is formed at the bottom of the second control gate CCG1.

Operation Method of a Memory of the Invention:

To settle the above technical issue, the invention provides an operation method of a memory. The memory comprises a plurality of memory cells 1. Each memory cell 1 comprises a first gate structure 104, a second gate structure 105, a third gate structure 106, a first source-drain region 102 and a second source-drain region 103.

The first gate structure 104 is formed by superposition of a first gate dielectric layer 107, a floating gate 108, a second gate dielectric layer 109 and a polysilicon control gate 110 which are formed on a surface of a semiconductor substrate 101.

The second gate structure 105 consists of a third gate dielectric layer 111 and a polysilicon gate 112 which are formed on the surface of the semiconductor substrate 101.

The third gate structure 106 is formed by superposition of a first gate dielectric layer 107, a floating gate 108, a second gate dielectric layer 109 and a polysilicon control gate 110 which are formed on the surface of the semiconductor substrate 101.

A channel region is formed by a part, located between the first source-drain region 102 and the second source-drain region 103, of the semiconductor substrate 101.

The first gate structure 104, the second gate structure 105 and the third gate structure 106 are arrayed on a surface of the channel region located between the first source-drain region 102 and the second source-drain region 103, and formation of a channel on the surface of the channel region is controlled by the first gate structure 104, the second gate structure 105 and the third gate structure 106.

The polysilicon control gate 110 of the first gate structure 104 serves as a first control gate CCG0 of the memory cell 1, the polysilicon gate 112 of the second gate structure 105 serves as a select gate CWL of the memory cell 1, and the polysilicon control gate 110 of the third gate structure 106 serves as a second control gate CCG1 of the memory cell 1. In FIG. 1, the first source-drain region 102 is connected to a source S, and the second source-drain 103 is connected to a drain D.

The floating gate 108 of the first gate structure 104 serves as a first memory bit, and the floating gate 108 of the third gate structure 106 serves as a second memory bit. Erasing and programming operations on the first memory bit and the second memory bit are realized by FN tunneling. The memory cell 1 is erased or programmed through the following method:

The first source-drain region 102 and the second source-drain region 103 are grounded.

The memory bits are selected and then erased or programmed by controlling voltages of the first control gate CCG0, the select gate CWL and the second control CCG1.

As shown in FIG. 2, all the memory cells 1 are arrayed in rows and columns to form an array structure 2. As for the array structure 2:

In each row, the select gates CWL of the memory cells 1 are connected to a corresponding word line, the first source-drain regions 102 of the memory cells 1 are connected to a corresponding source line, and the memory cells 1 in every two adjacent rows share one source line.

In each column, the first control gates CCG0 of the memory cells 1 are connected to a corresponding first control line, the second control gates CCG1 of the memory cells 1 are connected to a corresponding second control line, and the second source-drain regions 103 of the memory cells 1 are connected to a corresponding bit line.

The memory bits of the corresponding memory cells 1 are selected and then erased or programmed by controlling the word lines, the first control lines and the second control lines.

After being selected, the memory bits of the memory cells 1 are read via the source lines and the bit lines.

In this embodiment, the first source-drain region 102 and the second source-drain region 103 are N+ regions, and the semiconductor substrate 101 is P-type doped.

When the first memory bit of the memory cell 1 is erased after being selected, a first positive voltage is applied to the select gate CWL, a first negative voltage is applied to the first control gate CCG0, and the first positive voltage is also applied to the second control gate CCG1.

When the second memory bit of the memory cell 1 is erased after being selected, a first positive voltage is applied to the select gate CWL, the first positive voltage is also applied to the first control gate CCG0, and a first negative voltage is applied to the second control gate CCG1.

When erased, the corresponding memory bit of the memory cell 1 has a first threshold voltage.

When the first memory bit of the memory cell 1 is programmed after being selected, a first negative voltage is applied to the select gate CWL, a first positive voltage is applied to the first control gate CCG0, and the first negative voltage is also applied to the second control gate CCG1.

When the second memory bit of the memory cell 1 is programmed after being selected, a first negative voltage is applied to the select gate CWL, the first negative voltage is also applied to the first control gate CCG0, and a first positive voltage is applied to the second control gate CCG1.

When programmed, the corresponding memory bit of the memory cell 1 has a second threshold value, wherein the second threshold voltage is greater than the first threshold voltage.

When the first memory bit of the memory cell 1 is read after being selected, a second positive voltage is applied to the select gate CWL, a third positive voltage is applied to the first control gate CCG0, a fourth positive voltage is applied to the second control gate CCG1, and a pair of reading voltages is accessed between the first source-drain region 102 and the second source-drain region 103.

The second positive voltage, the third positive voltage and the fourth positive voltage are smaller than the first positive voltage.

A threshold voltage corresponding to the channel formed at the bottom of the select gate CWL is a third threshold voltage, wherein the second positive voltage is greater than or equal to the third threshold voltage.

The third positive voltage is greater than or equal to the first threshold voltage and is smaller than the second threshold voltage, and the fourth positive voltage is greater than or equal to the second threshold voltage.

The invention is detailed above with specific embodiments, but these specific embodiments are not intended to limit the invention. Various transformations and improvements can be made by those skilled in this field without deviating from the principle of the invention, and all these transformations and improvements should also fall within the protection scope of the invention.

What is claimed is:

1. A memory comprising:

a plurality of memory cells, wherein each of the memory cells comprises a first gate structure, a second gate structure, a third gate structure, a first source-drain region and a second source-drain region;

wherein the first gate structure is formed by superposition of a first gate dielectric layer, a first floating gate, a second gate dielectric layer and a first polysilicon control gate which are formed on a surface of a semiconductor substrate;

wherein the second gate structure comprises a third gate dielectric layer and a polysilicon gate which are formed on the surface of the semiconductor substrate;

wherein the third gate structure is formed by superposition of a fourth gate dielectric layer, a second floating gate, a fifth gate dielectric layer and a second polysilicon control gate which are formed on the surface of the semiconductor substrate;

wherein a channel region is formed by a part, located between the first source-drain region and the second source-drain region, of the semiconductor substrate;

wherein the first gate structure, the second gate structure and the third gate structure are arrayed on a surface of the channel region located between the first source-drain region and the second source-drain region, and formation of a channel on the surface of the channel region is controlled by the first gate structure, the second gate structure and the third gate structure;

wherein the first polysilicon control gate of the first gate structure serves as a first control gate of the memory cell, the polysilicon gate of the second gate structure serves as a select gate of the memory cell, and the second polysilicon control gate of the third gate structure serves as a second control gate of the memory cell;

wherein the first floating gate of the first gate structure serves as a first memory bit, the second floating gate of the third gate structure serves as a second memory bit, and erasing and programming operations on the first memory bit and the second memory bit are realized by FN tunneling; during erasing, the first source-drain region and the second source-drain region are grounded;

wherein the voltages of the first control gate, the select gate, and the second control gate are controlled to realize the selection of the memory bits and erase the selected memory bits;

wherein during programming, the first source-drain region and the second source-drain region are grounded, the voltages for the first control gate, the select gate and the second control gate are controlled to realize the selection of the memory bits and program the selected memory bits; and wherein all the memory cells are arrayed in rows and columns to form an array structure; the array structure comprising:

in each row, the select gates of the memory cells interconnect to a respective word line, and the first source-drain regions of the memory cells interconnect to a respective source line; and in each column, the first control gates of the memory cells interconnect to a respective first control line, the second control gates of the memory cells interconnect to a respective second control line, and the second source-drain regions of the memory cells interconnect to a bit line;

wherein the memory bits of the corresponding memory cells are selected and then erased or programmed by controlling the word lines, the first control lines and the second control lines; and wherein after being selected, the memory bits of the memory cells are read via the source lines and the bit lines.

2. The memory according to claim 1, wherein the first source-drain region and the second source-drain region are N+ regions, and the semiconductor substrate is P-type doped.

3. The memory according to claim 2, wherein when the first memory bit of the memory cell is erased after being selected, a first positive voltage is applied to the select gate, a first negative voltage is applied to the first control gate, and the first positive voltage is also applied to the second control gate; or wherein when the second memory bit of the memory cell is erased after being selected, a first positive voltage is applied to the select gate, the first positive voltage is also applied to the first control gate, and a first negative voltage is applied to the second control gate; and wherein when erased, the corresponding memory bit of the memory cell has a first threshold voltage.

4. The memory according to claim 3, wherein when the first memory bit of the memory cell is programmed after being selected, a first negative voltage is applied to the select gate, a first positive voltage is applied to the first control gate, and the first negative voltage is also applied to the second control gate; or wherein when the second memory bit of the memory cell is programmed after being selected, a first negative voltage is applied to the select gate, the first negative voltage is also applied to the first control gate, and a first positive voltage is applied to the second control gate; and wherein when programmed, the corresponding memory bit of the memory cell has a second threshold value, wherein the second threshold voltage is greater than the first threshold voltage.

5. The memory according to claim 4, wherein when the first memory bit of the memory cell is read after being selected, a second positive voltage is applied to the select gate, a third positive voltage is applied to the first control gate, a fourth positive voltage is applied to the second control gate, and a pair of reading voltages is accessed between the first source-drain region and the second source-drain region;

wherein the second positive voltage, the third positive voltage and the fourth positive voltage are smaller than the first positive voltage;

wherein a threshold voltage corresponding to a channel formed at a bottom of the select gate is a third threshold voltage, wherein the second positive voltage is greater than or equal to the third threshold voltage; and wherein the third positive voltage is greater than or equal to the first threshold voltage and is smaller than the second threshold voltage, and the fourth positive voltage is greater than or equal to the second threshold voltage.

6. The memory according to claim 1, wherein the memory cells in every two adjacent rows share one said source line.

7. The memory according to claim 1, wherein the semiconductor substrate is a silicon substrate, the first floating gates and second floating gates are polysilicon floating gates, the first dielectric layers are oxide layers, the second dielectric layers are oxide layers, and the third gate dielectric layers are oxide layers, the fourth dielectric layers are oxide layers, and the fifth gate dielectric layers are oxide layers.

8. An operation method of a memory that comprises a plurality of memory cells, and each said memory cell comprises a first gate structure, a second gate structure, a third gate structure, a first source-drain region and a second source-drain region;
wherein the first gate structure is formed by superposition of a first gate dielectric layer, a first floating gate, a second gate dielectric layer and a first polysilicon control gate which are formed on a surface of a semiconductor substrate;
wherein the second gate structure comprising a third gate dielectric layer and a polysilicon gate which are formed on the surface of the semiconductor substrate;
wherein the third gate structure is formed by superposition of a fourth gate dielectric layer, a second floating gate, a fifth gate dielectric layer and a second polysilicon control gate which are formed on the surface of the semiconductor substrate;
wherein a channel region is formed by a part, located between the first source-drain region and the second source-drain region, of the semiconductor substrate;
wherein the first gate structure, the second gate structure and the third gate structure are arrayed on a surface of the channel region located between the first source-drain region and the second source-drain region, and formation of a channel on the surface of the channel region is controlled by the first gate structure, the second gate structure and the third gate structure;
wherein the first polysilicon control gate of the first gate structure serves as a first control gate of the memory cell, the polysilicon gate of the second gate structure serves as a select gate of the memory cell, and the second polysilicon control gate of the third gate structure serves as a second control gate of the memory cell; and
wherein the first floating gate of the first gate structure serves as a first memory bit, the floating gate of the third gate structure serves as a second memory bit; the method of operation comprising:
erasing and programming operations on the first memory bit and the second memory bit by FN tunneling; the operation method comprising:
erasing the memory cell by:
grounding the first source-drain region and the second source-drain region;
selecting the memory bits; and
controlling voltages of the first control gate, the select gate and the second control gate to erase the selected memory bits;
programming the memory cell by:
grounding the first source-drain region and the second source-drain region;
selecting the memory bits; and
controlling voltages of the first control gate, the select gate and the second control gate; and wherein all the memory cells are arrayed in rows and columns to form an array structure; the array structure comprising:
in each row, the select gates of the memory cells interconnect to a respective word line, and the first source-drain regions of the memory cells interconnect to a respective source line; and
in each column, the first control gates of the memory cells interconnect to a respective first control line, the second control gates of the memory cells interconnect to a respective second control line, and the second source-drain regions of the memory cells interconnect to a respective bit line; the operation method further comprising:
selecting the memory bits of the corresponding memory cells; and
erasing or programming the memory bits by controlling the word lines, the first control lines and the second control lines; and
after being selected, reading the memory bits of the memory cells are read via the source lines and the bit lines.

9. The operation method of the memory according to claim 8, wherein the first source-drain region and the second source-drain region are N+ regions, and the semiconductor substrate is P-type doped.

10. The operation method of the memory according to claim 9, wherein when the first memory bit of the memory cell is erased after being selected, a first positive voltage is applied to the select gate, a first negative voltage is applied to the first control gate, and the first positive voltage is also applied to the second control gate; or
wherein when the second memory bit of the memory cell is erased after being selected, a first positive voltage is applied to the select gate, the first positive voltage is also applied to the first control gate, and a first negative voltage is applied to the second control gate; and
wherein when erased, the corresponding memory bit of the memory cell has a first threshold voltage.

11. The operation method of the memory according to claim 10, wherein when the first memory bit of the memory cell is programmed after being selected, a first negative voltage is applied to the select gate, a first positive voltage is applied to the first control gate, and the first negative voltage is also applied to the second control gate; or
wherein when the second memory bit of the memory cell is programmed after being selected, a first negative voltage is applied to the select gate, the first negative voltage is also applied to the first control gate, and a first positive voltage is applied to the second control gate; and
wherein when programmed, the corresponding memory bit of the memory cell has a second threshold value, wherein the second threshold voltage is greater than the first threshold voltage.

12. The operation method of the memory according to claim 11, wherein when the first memory bit of the memory cell is read after being selected, a second positive voltage is applied to the select gate, a third positive voltage is applied to the first control gate, a fourth positive voltage is applied to the second control gate, and a pair of reading voltages is accessed between the first source-drain region and the second source-drain region;
wherein the second positive voltage, the third positive voltage and the fourth positive voltage are smaller than the first positive voltage;

wherein a threshold voltage corresponding to a channel formed at a bottom of the select gate is a third threshold voltage, wherein the second positive voltage is greater than or equal to the third threshold voltage; and wherein the third positive voltage is greater than or equal to the first threshold voltage and is smaller than the second threshold voltage, and the fourth positive voltage is greater than or equal to the second threshold voltage.

13. The operation method of the memory according to claim 8, wherein the memory cells in every two adjacent rows share one said source line.

* * * * *